(12) United States Patent
Isaacson et al.

(10) Patent No.: US 7,495,266 B2
(45) Date of Patent: Feb. 24, 2009

(54) STRAINED SILICON-ON-SILICON BY WAFER BONDING AND LAYER TRANSFER

(75) Inventors: David M. Isaacson, Boston, MA (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/869,814

(22) Filed: Jun. 16, 2004

(65) Prior Publication Data

US 2005/0280026 A1    Dec. 22, 2005

(51) Int. Cl.
*H01L 31/0328* (2006.01)
(52) U.S. Cl. .......................... 257/190; 257/19; 257/20; 257/24; 257/191; 257/192; 257/E21.232; 257/E21.284; 257/E21.546
(58) Field of Classification Search ............. 257/19–20, 257/24, 190–192
See application file for complete search history.

(56) References Cited

U.S. PATENT DOCUMENTS

| | | | | |
|---|---|---|---|---|
| 5,461,250 | A * | 10/1995 | Burghartz et al. | 257/347 |
| 6,893,936 | B1 * | 5/2005 | Chen et al. | 438/407 |
| 6,924,181 | B2 * | 8/2005 | Huang et al. | 438/197 |
| 7,202,530 | B2 * | 4/2007 | Forbes | 257/347 |
| 2002/0140031 | A1 * | 10/2002 | Rim | 257/347 |
| 2003/0030091 | A1 * | 2/2003 | Bulsara et al. | 257/301 |
| 2004/0026765 | A1 | 2/2004 | Currie et al. | |
| 2004/0074866 | A1 | 4/2004 | Fournel et al. | |
| 2004/0217352 | A1 * | 11/2004 | Forbes | 257/65 |
| 2005/0020094 | A1 * | 1/2005 | Forbes et al. | 438/784 |
| 2005/0104067 | A1 * | 5/2005 | Chu et al. | 257/66 |
| 2005/0202604 | A1 * | 9/2005 | Cheng et al. | 438/151 |
| 2005/0230676 | A1 * | 10/2005 | Bae et al. | 257/19 |

(Continued)

FOREIGN PATENT DOCUMENTS

JP    2001-291864    * 10/2001

(Continued)

OTHER PUBLICATIONS

Zhixiong Liu et al., "Micromechanism Fabrication using Silicon Fusion Bonding," Robotics and Computer Integrated manufacturing 17, 2001, pp. 131-137.

(Continued)

*Primary Examiner*—A. Sefer
(74) *Attorney, Agent, or Firm*—Wolf, Greenfield & Sacks, P.C.

(57) ABSTRACT

A semiconductor-based structure includes first and second layers bonded directly to each other at an interface. Parallel to the interface, the lattice spacing of the second layer is different than the lattice spacing of the first layer. The first and second layers are each formed of essentially the same semiconductor. A method for making a semiconductor-based structure includes providing first and second layers that are formed of essentially the same semiconductor. The first and second layers have, respectively, first and second surfaces. The second layer has a different lattice spacing parallel to the second surface than the lattice spacing of the first layer parallel to the first surface. The method includes contacting the first and second surfaces, and annealing to promote direct atomic bonding between the first and second layers.

14 Claims, 6 Drawing Sheets

U.S. PATENT DOCUMENTS

2005/0247926 A1\* 11/2005 Sun et al. .................. 257/19
2005/0250294 A1\* 11/2005 Ghyselen .................. 438/458

FOREIGN PATENT DOCUMENTS

| WO | WO 99/53539 | A1 | 10/1999 |
| WO | WO 0100522 | A2 | 1/2001 |
| WO | WO 01/99169 | A2 | 12/2001 |
| WO | WO 03/094239 | \* | 11/2003 |
| WO | WO 2004/000632 | A2 | 1/2004 |
| WO | WO 2004/002142 | A2 | 3/2004 |

OTHER PUBLICATIONS

A.C. Gracias et al., "Experiments on Silicon-To-Silicon Direct Bonding," XIII Meeting of the Brazilian Vacuum Society, Campinas, Brazil, Jul. 1998, pp. 19-22.

International Search Report PCT/US2005/021283, dated Oct. 28, 2005.

Langdo et al., "SiGe-Free Strained Si on Insulator by Wafer Bonding and Layer Transfer," Applied Physics Letters, Jun. 16, 2003, pp. 4256-4257, vol. 82, No. 24, American Institute of Physics, Melville, NY, US.

Taraschi, et al., "Relaxed SiGe-on-insulator fabricated via wafer bonding and etch back," Journal of Vacuum Science and Technology, Mar. 2002, pp. 725-726, vol. 20, No. 2, American Institute of Physics, New York, NY, US.

Pitera et al., "Coplanar Integration of Lattice-Mismatched Semiconductors with Silicon by Wafer Bonding Ge/Si1-xGex/Si Virtual Substrates," Feature Article ISSN 0013-4651, 2004, pp. G443-447, vol. 151, No. 7, Journal of The Electrochemical Society, Inc.

Taraschi et al., "Strained Si, SiGe, and Ge on-insulator: review of wafer bonding fabrication techniques," Feature Article ISSN 0038-1101, 2004, pp. 1297-1305, vol. 48, Solid-State Electronics.

Taraschi et al., "Ultrathin Strained Si-on-Insulator and SiGe-on-Insulator Created using Low Temperature Wafer Bonding and Metastable Stop Layers," Feature Article ISSN 0013-4651, 2004, pp. G47-G56, vol. 151, No. 1, Journal of The Electrochemical Society, Inc.

Erratum of B9, Journal of Materials Science Materials in Electronics ISSN 0957-4522, Oct. 2002, p. 621, vol. 13, No. 10.

Cheng et al., "Relaxed silicon-germanium on insulator substrate by layer transfer," Feature Article, Dec. 2001, pp. L37-39, vol. 30, No. 12, Journal of Electronic Materials.

Currie, et al., "Carrier mobilities and process stability of strained Si n- and p-MOSFETs on SiGe virtual substrates," Journal of Vacuum Science & Technology, Nov. 2001, pp. 2268-2279, vol. 19, No. 6, American Vacuum Society.

Lee et al., "Strained Ge channel $p$-type metal-oxide-semiconductor field-effect transistors grown on $Si_{1-x} GE_x/$ Si virtual substrates," Applied Physics Letters, Nov. 12, 2001, pp. 3344-3346, vol. 79, No. 20, American Institute of Physics.

Cheng et al., "Electron mobility enhancement in strained-Si n-MOSFETs fabricated on SiGe-on-insulator (SGOI) substrates," IEEE Electronic Device Letters, Jul. 2001, pp. 321-323, vol. 22, No. 7.

Sieg et al., "High minority-carrier lifetimes in GaAs grown on low-defect-density Ge/GeSi/Si substrates," Applied Physics Letters, Nov. 23, 1998, pp. 3111-3113, vol. 73, No. 21, American Institute of Physics.

Taraschi et al., "Strained-Si-on-Insulator (SSOI) and SiGe-on-Insulator (SGOI): Fabrication obstacles and Solutions," Symposium, Dec. 2-4, 2002, pp. 105-110, vol. 745, Material Identity No. XX-2003-01738, Mater. Res. Soc. Symposium Proceedings.

Gianni Taraschi, "Strained Si-on-insulator development accelerates," Journal: Compound Semiconductor, ISSN 1096-598X, Apr. 2003, pp. 25-27, vol. 9, No. 3, Franklin Publishing, US.

Lee et al., "Strained Ge channel $p$-type MOSFETs fabricated on $Si_{1-x} GE_x//Si$ virtual substrates," Symposium, Nov. 26-28, 2001, pp. 39-43, vol. 686, Mater. Res. Soc., Warrendale, PA, US.

Cheng et al., "Relaxed silicon-germanium on insulator (SGOI)," Symposium, Nov. 26-28, 2001, pp. 21-26, vol. 686, Mater. Res. Soc., Warrendale, PA, US.

Taraschi et al., "Relaxed SiGe on insulator fabricated via wafer bonding and layer transfer: Etch-back and smart-cut alternatives," Proceedings of the Tenth International Symposium (Electrochemical Society Proceedings), Mar. 25-29, 2001, pp. 27-32, vol. 2001-3, Electrochemical Soc., Pennington, NJ, US.

Cheng et al., "SiGe-on-Insulator (SGOI): substrate preparation and MOSFET fabrication for electron mobility evaluation," Conference: 2001 IEEE International SOI Conference, Oct. 1-4, 2001, pp. 13-14, Cat. No. 01CH37207, IEEE, Piscataway, NJ, US.

Fitzgerald et al., "Dislocations in relaxed SiGe/Si heterostructures," International Conference on Extended Defects in Semiconductors (EDS'98), Sep. 6-11, 1998, pp. 227-238, vol. 171, No. 1, Journal: Physica Status Solidi A, Wiley-VCH, Germany.

\* cited by examiner

STRAINED SILICON-ON-SILICON BY WAFER BONDING AND LAYER TRANSFER

BACKGROUND OF INVENTION

1. Field of Invention

The invention relates to semiconductor-based electronic devices, and, more particularly, to the structure and fabrication of semiconductor-based substrates and electronic devices that include strained semiconductor layers.

2. Discussion of Related Art

Some advanced semiconductor-based devices include a semiconductor layer that is strained by application of a stress to provide improved performance of the devices. For example, metal-oxide-semiconductor (MOS) transistors having a channel formed in strained silicon or strained $Si_{1-y}Ge_y$ formed on unstrained, or relaxed, $Si_{1-x}Ge_x$, can exhibit improved carrier mobility in comparison to traditional p-type MOS (PMOS) and n-type MOS (NMOS) transistors. Strained-layer MOS transistors can be formed on "virtual substrates," which include a strained layer to provide compatibility with traditional silicon-based fabrication equipment and methods that were designed for use with conventional silicon wafers. A virtual substrate, in contrast to a conventional wafer, typically includes a strained silicon layer grown on a relaxed and/or graded $Si_{1-x}Ge_x$ layer in turn grown on a silicon substrate.

To fabricate high-performance devices on these platforms, thin strained layers of semiconductors, such as Si, Ge, or $Si_{1-y}Ge_y$, can be grown on the relaxed $Si_{1-x}Ge_x$ of a virtual substrate. The resulting biaxial tensile or compressive strain of the grown layers alters their carrier mobilities, enabling the fabrication of high-speed and/or low-power devices.

The relaxed $Si_{1-x}Ge_x$ layer of a virtual substrate can in turn be prepared by, e.g., wafer bonding or direct epitaxy on Si, or by epitaxy on a graded SiGe buffer layer in which the lattice constant of the SiGe material has been gradually increased over the thickness of the buffer layer. The virtual substrate may also incorporate buried insulating layers, in the manner of a silicon-on-insulator (SOI) wafer. Deposition of a relaxed graded SiGe buffer layer enables engineering of the in-plane lattice constant of a relaxed $Si_{1-x}Ge_x$ virtual substrate layer (and therefore the amount of strain the relaxed layer will induce in a strained silicon layer or other overlying layer,) while also reducing the introduction of threading dislocations, which can be deleterious to device layers fabricated on the top-most region of the wafer. The lattice constant of $Si_{1-x}Ge_x$ is larger than that of Si, and is a function of the amount of Ge in the $Si_{1-x}Ge_x$ alloy.

Unfortunately, $Si_{1-x}Ge_x$-based substrates can increase the complexity of device fabrication. For example, source and drain contact metallurgy is altered, and interdiffusion between $Si_{1-x}Ge_x$ layers and neighboring layers can occur. As an alternative to a $Si_{1-x}Ge_x$-based substrate, strained silicon can be provided on an oxide layer of a substrate. The presence of the oxide layer, however, forces process modifications. Further, oxide layers and $Si_{1-x}Ge_x$ layers have reduced thermal conductivity in comparison to conventional silicon wafers. A reduced thermal conductivity can cause an increase in the difficulty of removing heat at a sufficient rate from devices formed on a substrate.

SUMMARY OF INVENTION

The invention arises, in part, from the realization that two layers formed of the same semiconducting material, but having different levels of strain, can be bonded directly to one another to maintain a strain in at least one of the layers. Thus, undesirable strain-inducing layers found in prior substrates can be eliminated, while preserving the benefits of utilization of a strained layer. For example, a strained silicon layer can be bonded to an unstrained silicon substrate to eliminate the presence of a $Si_{1-x}Ge_x$ layer and/or an oxide layer in the substrate.

Accordingly, in one aspect, the invention features a semiconductor-based structure. The structure includes first and second layers bonded directly to each other at an interface. Parallel to the interface, the lattice spacing of the second layer is different than the lattice spacing of the first layer. The first and second layers are each formed of essentially the same semiconductor. The semiconductor can be, for example, silicon or germanium.

In another aspect, the invention features an electronic device. The device includes a substantially strain-free substrate layer, and a tensilely or compressively strained layer on the substrate layer. Each layer is formed of essentially the same semiconductor, for example, of silicon or germanium. The layers are directly bonded to one another. The device also includes a gate dielectric layer adjacent to the tensilely or compressively strained layer, and a gate in contact with the gate dielectric layer. The device can be, for example, a transistor.

In another aspect, the invention features a method for making a semiconductor-based structure. The method includes providing first and second layers that are formed of essentially the same semiconductor. The first and second layers have, respectively, first and second surfaces. The second layer has a different lattice spacing parallel to the second surface than the lattice spacing of the first layer parallel to the first surface. The method also includes contacting the first and second surfaces, and annealing to promote direct atomic bonding between the first and second layers.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
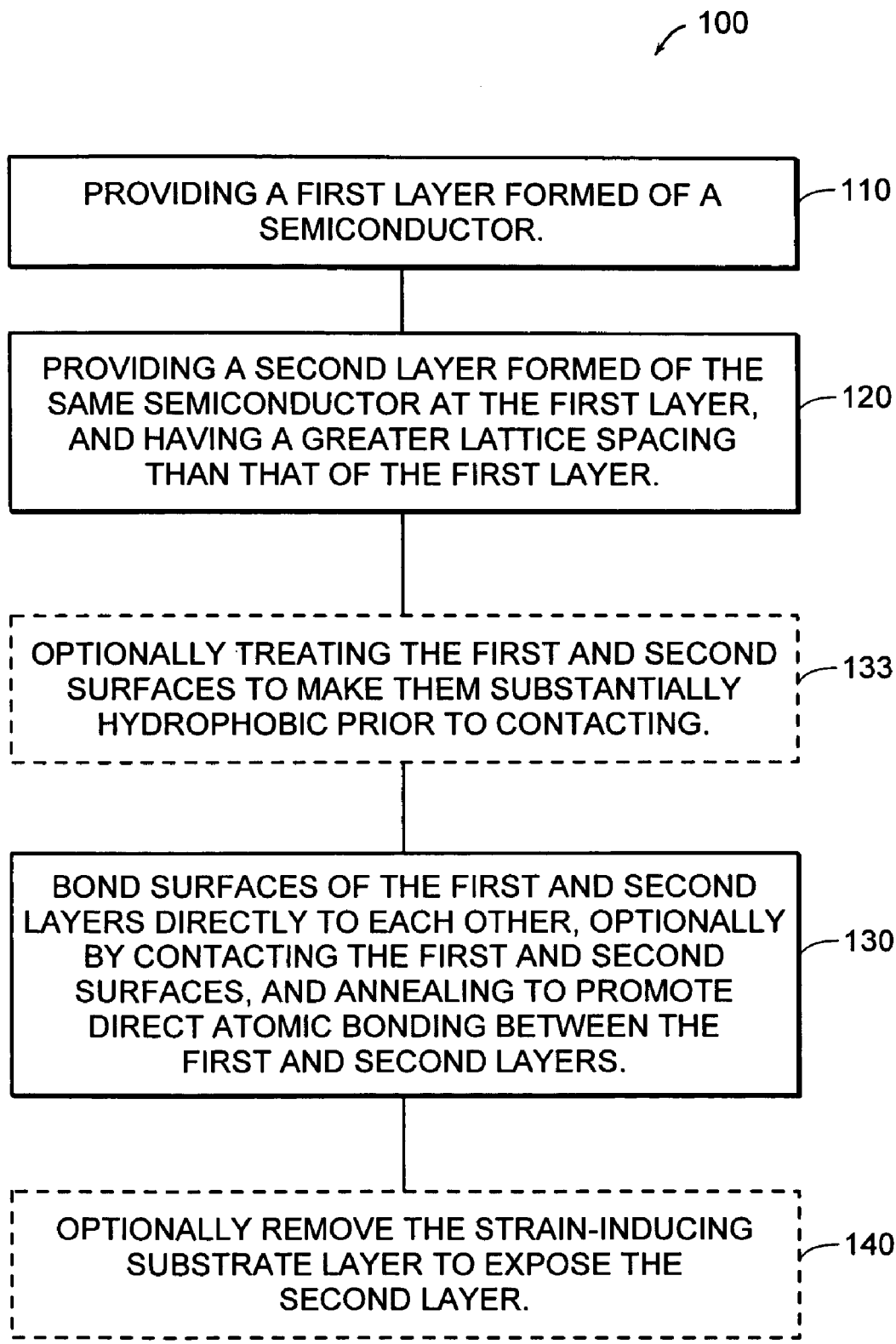
FIG. 1 is a flowchart of an embodiment of a method for making a semiconductor-based structure, according to principles of the invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing,", "involving," and variations thereof herein, is meant to encompass the items listed thereafter and equivalents thereof as well as additional items.

The term "MOS" is used in this description to refer generally to semiconductor devices that include a conductive gate spaced at least by an insulating layer from a semiconducting channel layer. The terms "SiGe" and "$Si_{1-x}Ge_x$" are used in this description, depending on context, to interchangeably refer to silicon-germanium alloys. The term "silicide" is used in this description to refer to a reaction product of a metal, silicon, and optionally other components, such as germanium. The term "silicide" is also used, less formally, to refer to the reaction product of a metal with an elemental semiconductor, a compound semiconductor or an alloy semiconductor.

The term "virtual substrate" may refer to a substrate that includes a relaxed strain-inducing semiconductor layer, such as a relaxed SiGe layer, or may refer to a substrate comprising an insulator layer which maintains pre-induced strains in subsequently provided layers. The strain levels thus maintained are analogous to those induced by a strain-inducing semiconductor layer. For example, a strain of about 1.2% is induced in a SiGe layer by a virtual-substrate SiGe layer having a Ge concentration difference of approximately 30% (elemental concentrations in alloys are given herein in units of atomic %.) As described in more detail below, a strained layer can also be bonded to an insulator layer or to a semiconductor layer, and the strain can then be maintained without the presence of the original strain-inducing layer. Thus, language specifying the Ge content of the virtual substrate layer may also apply interchangeably to strained semiconductor layers that are equivalently strained by, and disposed adjacent to, an insulating substrate, where the strain in the semiconductor layers is maintained by the strong interface with the substrate.

The present invention will now be described by way of specific, non-limiting, examples. It should be understood that the invention applies to substrates, devices, and fabrication methods beyond those discussed here. Specific structures, devices, and fabrication steps are meant for illustrative purposes only, and are non-limiting.

With reference to FIG. 1, some general principles of the invention are described in broad overview. According to principles of the invention, a strained semiconductor layer can be directly bonded to a layer or substrate formed of the same semiconductor though having a different strain. The strained semiconductor can be advantageously utilized for fabrication of semiconductor-based devices. For example, a strained silicon layer can be directly bonded to an unstrained silicon substrate, and can then be utilized as a channel layer for a MOS device. As used herein, "directly bonded" refers to a bond between two layers that involves direct contact between the two layers.

FIG. 1 is a flowchart of an embodiment of a method 100 for making a semiconductor-based structure, according to principles of the invention. Some examples of structures that can be fabricated via the method 100 are described below with reference to FIGS. 3, 4, and 5. The method 100 includes providing a first layer formed of a semiconductor (Step 110), providing a second layer formed of essentially the same semiconductor as the first layer, but having a different strain than a strain of the first layer (Step 120), and bonding the first layer directly to the second layer (Step 130). The order herein of the description or listing of steps of the method 100 should not be construed to require a particular temporal sequence nor to preclude simultaneity of steps.

The semiconductor of the first and second layers is the same material if the layers are formed from essentially the same semiconducting element, formed from the same semiconducting alloy having essentially the same composition in each layer, or formed of essentially the same semiconducting compound. As will be understood by one having ordinary skill in the semiconductor arts, two semiconductors that are essentially the same may include different types and/or amounts of unintentional impurities, intentional impurities, and or crystalline defects. The word "essentially" is used herein to accommodate small variations in composition that have an insignificant or minor effect on the beneficial features of embodiments of substrates according to principles of the invention.

The first and second layers can have a common crystallographic orientation after bonding. That is, the first and second layers can be oriented, prior to bonding (Step 130), so that no tilt or twist misorientation exists between the layers when they are brought into contact and bonded. The layers can be bonded at substantially planar surfaces to provide a bonded interface that is free of voids. Moreover, the surfaces of the two layers are preferably provided with the same crystallographic orientation. Interfacial defects associated with misorientation can be reduced in density or eliminated by reducing or eliminating misorientation prior to bonding.

In alternative embodiments of the invention, the surfaces of the two layers have different crystallographic orientations. For example, a (100)-oriented surface can be bonded to (111)-oriented surface, or surfaces that are slightly offcut from common orientations can be bonded.

The difference in strain between the first and second layers can manifest itself as a difference in a lattice spacing of the two layers along a direction parallel to the bonded interface. For example, if the two layers are formed of silicon, a lattice spacing of the silicon, parallel to the interface, can be greater in the second layer than in the first layer.

In some embodiments, according to principles of the invention, the second layer is strained while the first layer is substantially unstrained. Thus, for example, though the two layers have the same crystallographic structure, a lattice constant of the second layer can be distorted in comparison to a corresponding undistorted lattice constant of the first layer.

Prior to bonding, the first and second layers are preferably provided with root-mean-square (RMS) surface roughness values of about 0.5 nm or less on a 10 μm×10 μm scale. A suitable roughness can be obtained on, for example, a virtual substrate by chemo-mechanical polishing (CMP) utilizing a KOH-stabilized colloidal silica polishing agent. A strained silicon second layer can be grown, for example, on the polished virtual substrate. Deposition of strained silicon can proceed at relatively low temperatures to preserve a suitably flat surface.

According to principles of the invention, the first layer can be, for example, a substantially unstrained silicon surface layer provided on a SOI substrate, or can be, for example, a conventional silicon wafer. The second layer can be formed, and strained, by, for example, depositing silicon on a virtual substrate. The virtual substrate can have a strain-inducing surface layer, such as a SiGe layer, on which a silicon second layer is grown. The composition of the SiGe layer can be selected to provide a desired level of strain in the silicon second layer.

The strain-inducing substrate layer can be formed by co-depositing silicon and germanium at a temperature in a range of, for example, about 300° C. to about 1000° C. (preferably, about 500° C. to about 600° C.) to improve surface flatness of the SiGe. The second layer can be formed by depositing silicon at a temperature in a range of, for example, about 300° C. to about 1000° C. (preferably, about 500° C. to about 600° C.) The strain-inducing substrate layer is essentially strain-free. Growth of silicon, as well as SiGe, at reduced temperatures, for example, at about 550° C., can provide a smoother layer, and can permit growth of a thicker metastable layer, i.e., a layer in excess of the critical thickness that is substantially free of threading dislocations.

The surfaces can be bonded (Step 130) by, for example, contacting and annealing. Annealing can promote direct atomic bonding between the first and second layers. For silicon bonding, annealing can be performed by heating the first and second layers to a temperature of, for example, greater than about 700° C. For example, annealing can be performed at 800° C. for 2 hours.

Further, the first and second surfaces can be treated prior to contacting to make them substantially hydrophobic prior to contacting (Step 133). Provision of a hydrophobic surface can, prior to bonding (Step 130), reduce or eliminate formation of oxide on the layer surfaces. A hydrophobic surface can be obtained by, for example, bathing in a hydrofluoric acid (HF) solution, for example, a 10% HF solution in water, by volume. A dip in a HF solution also can remove surface oxides.

To remove organic material and/or particles from the surface of a silicon layer, the silicon can be treated in, for example, $3H_2OSO_4:1H_2O_2$ for 10 minutes, then in $50H_2O:1HF$ for 15 seconds, then in $6H_2O:1HCl:1H_2O_2$ for 15 minutes at 80° C., thus producing a hydrophilic surface. The silicon can then be treated in $10H_2O:1$ HF for 1 minute to remove surface oxide and bond fluorine to the surface, rendering the surface hydrophobic.

Since the bonds formed after initial contact can be weak, annealing is desirable after contacting (Step 135). Annealing at temperatures above about 700° C. can remove hydrogen bonded to the surfaces of the first and second layers and promote direct bonds between the two layers.

A virtual substrate, or other material, on which the second layer was provided, can be removed after bonding the second layer to the first layer, to expose the second layer (Step 140). Removal of material can commence with mechanical grinding and/or chemical etching. For example, a KOH solution can provide removal of layers and/or portions of layers of a virtual substrate, such as removal of silicon and selective removal of SiGe to an upper concentration level of Ge. For this purpose, 20 wt % KOH at about 65° C. to about 80° C. can be used. To selectively complete removal of a SiGe layer while leaving an adjacent silicon second layer, a chemical etch of nitric acid, acetic acid, and dilute HF ($100 H_2O:1$ HF), for example, can be used.

Figure 2A:
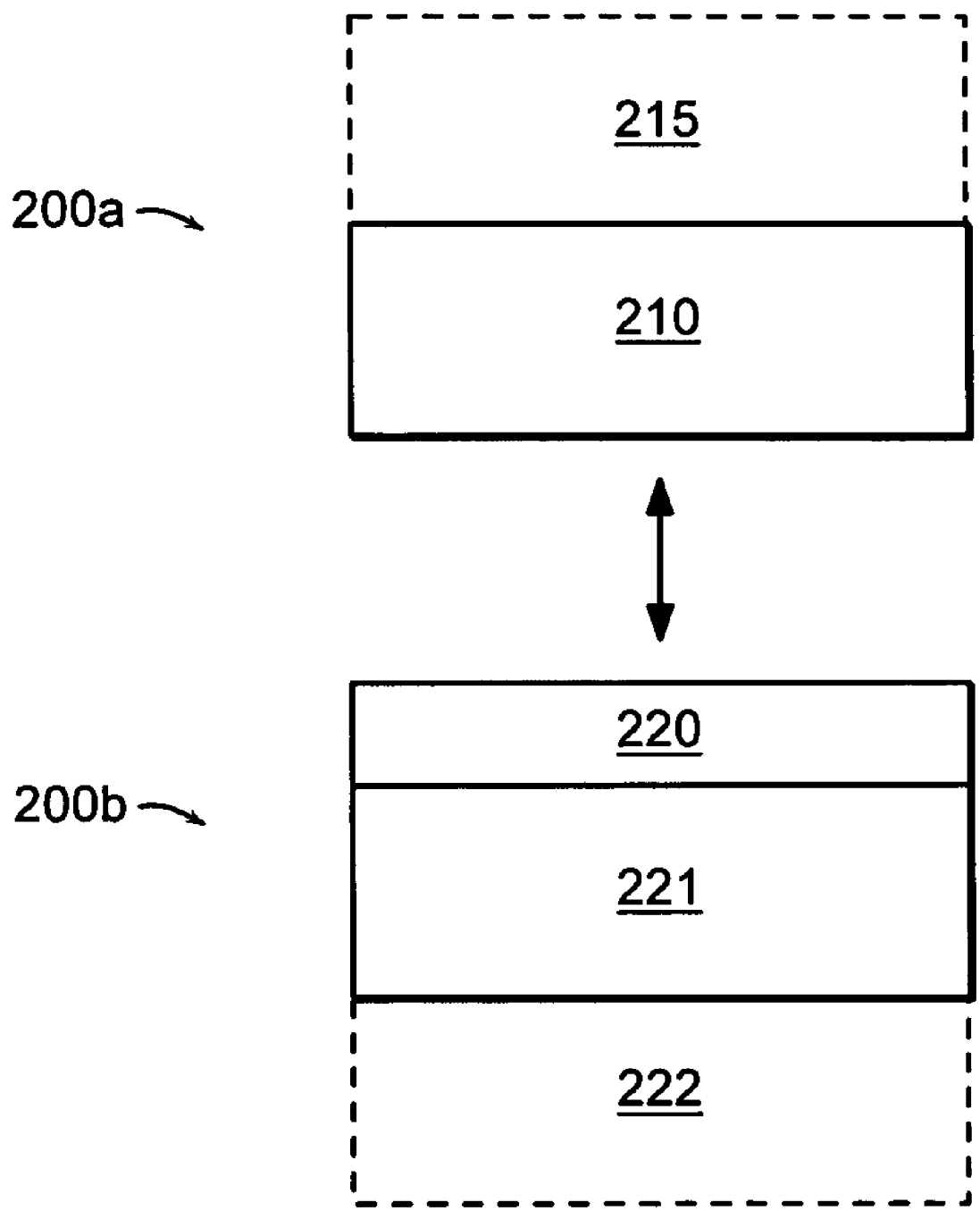
FIGS. 2a, 2b, and 2c are cross-sectional diagrams that illustrate the making of an example embodiment of a structure via the method illustrated in FIG. 1.
Figure 2B:
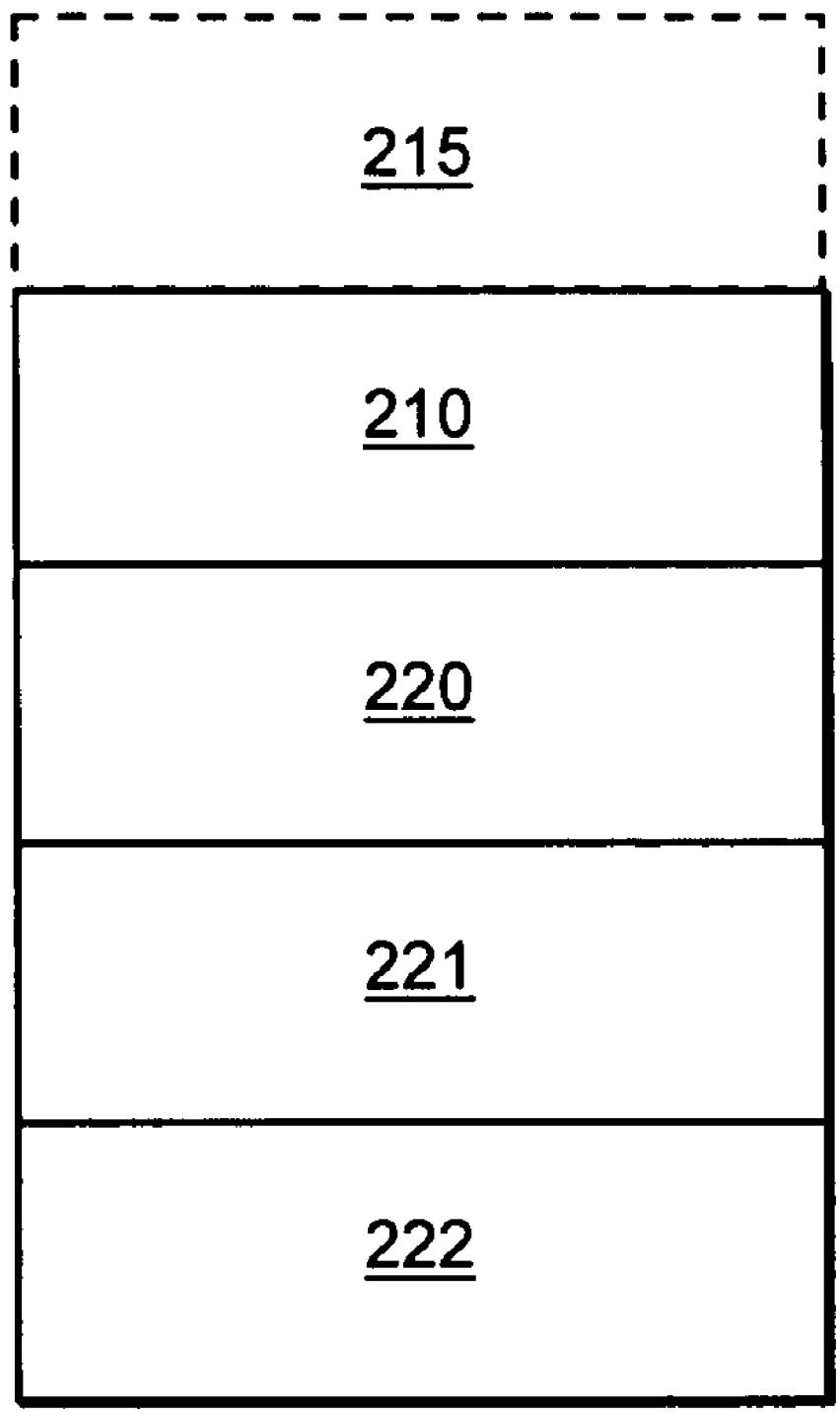
Figure 2C:
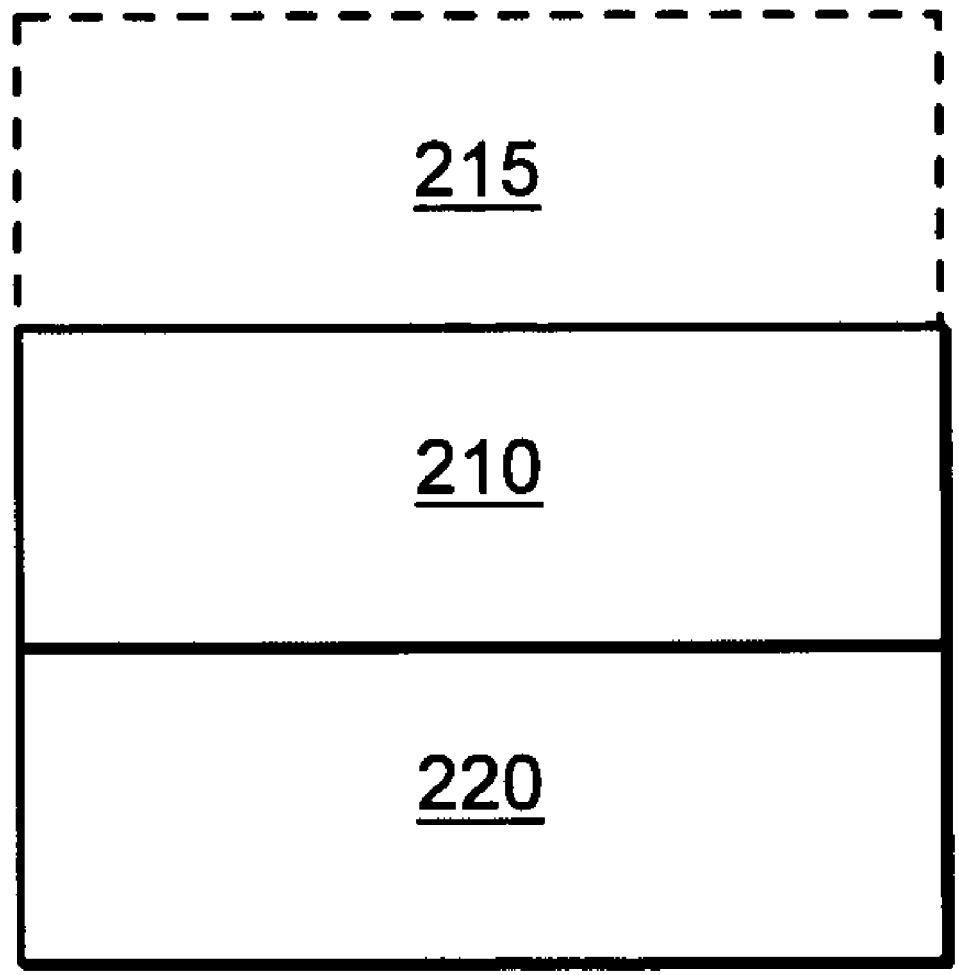

Now referring to FIGS. 2a, 2b, and 2c, embodiments of intermediate structures that illustrate various steps of the method 100 are described. FIG. 2a is a cross-sectional view of a first substrate 200a and a second substrate 200b at a time prior to bonding. The first substrate 200a includes a first layer 210, and can include one or more additional substrate layers 215. The second substrate 200b includes a second layer 220, e.g., a strained silicon layer, formed on a strain-inducing layer 221, e.g., a relaxed SiGe layer, and can include one or more additional layers 222.

FIG. 2b is a cross-sectional diagram of the substrates 200a, 200b as they appear after bonding of the first layer 210 to the second layer 220, as accomplished, for example, by Step 130 as described above. FIG. 2c is a cross-sectional diagram that illustrates a remaining semiconductor-based structure 200c that remains after removal of the strain-inducing layer 221 and any other layers 222. The structure 200c can be used, for example, to fabricate semiconductor-based devices.

As described in more detail with reference to FIGS. 4 and 5, the method 100 can include steps relating to formation of one or more components having n-type channels and/or one or more components having p-type channels. For example, in relation to forming a n-type channel component, the method 100 can include forming a gate dielectric layer adjacent to the exposed portion of a tensilely strained silicon second layer, and then forming a gate in contact with the gate dielectric layer for mediating a n-type channel in the second layer.

The method 100 can employ thin-film deposition techniques known to one having ordinary skill in the semiconductor fabrication arts. The techniques can be modified to improve surface planarity of the deposited films to mitigate poor planarity can arise during deposition of strained films. A strain-inducing layer and/or a second layer can be deposited, for example, at relatively low temperatures to improve planarity. For example, a strained silicon second layer may be deposited at about 650° C., substantially without causing undulations, on a SiGe strain-inducing layer having a Ge atomic concentration of 20%, while a Si second layer deposition temperature of about 550° C. is preferable for an underlying SiGe layer having a Ge concentration of 50%.

The strain-inducing substrate layer can be, or can be formed on, a graded SiGe layer. The graded SiGe layer can have a grading rate of, for example, 10% Ge/µm, and a thickness in a range of, for example, 2 µm to 9 µm. The graded layer may be grown at a temperature in a range of, for example, 600° C. to 1100° C.

A strain-inducing substrate layer, on which a strained second layer can be grown, can be a relaxed SiGe layer, which can in turn be grown on a graded SiGe layer. The relaxed layer can be formed of $Si_{1-x}Ge_x$ with a uniform concentration having X in a range of about 20% to 90%. The relaxed layer can have a thickness in a range of, for example, about 0.2 µm to about 2.0 µm. A strained second layer can be formed of strained silicon having a thickness in a range of, for example, about 0.5 nm to about 20 nm.

Deposition may be accomplished, for example, by any suitable epitaxial deposition system, including, but not limited to, atmospheric-pressure CVD (APCVD), low- (or reduced-) pressure CVD (LPCVD), ultra-high-vacuum CVD (UHVCVD), or by molecular beam epitaxy. The epitaxial growth system may be a single-wafer or multiple-wafer batch reactor. The growth system also may utilize a low-energy plasma to enhance the layer growth kinetics.

Figure 3:
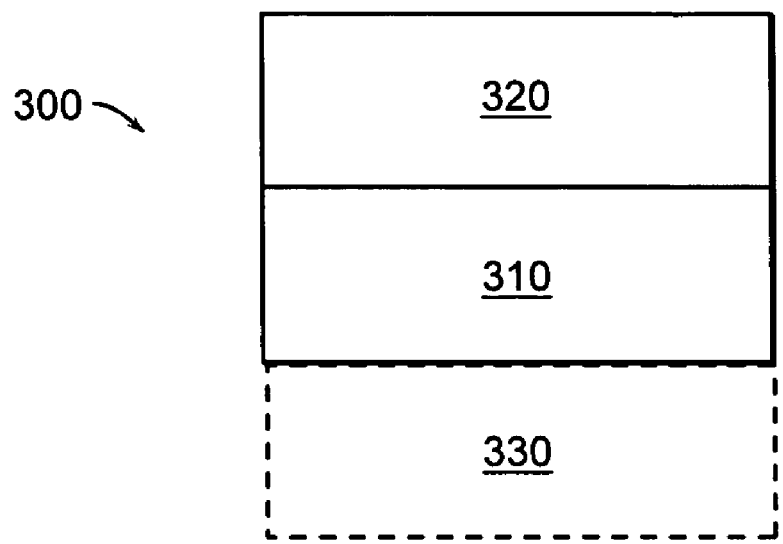
FIG. 3 is a cross-sectional diagram of an embodiment of a semiconductor-based structure, according to principles of the invention.

FIG. 3 is a cross-sectional view of a portion of an embodiment of a semiconductor-based structure 300, according to principles of the invention. The structure 300 includes a first layer 310 and a second layer 320 directly bonded to each other, and can include a substrate 330 in contact with the first layer 310. The structure 300 can be fabricated by, for example, the methods described above.

The first and second layers 310, 320 are formed of the same semiconductor. The semiconductor can be, for example, silicon. The layers 310, 320, as described above, have different levels of strain relative to each other. For example, the second layer 320 can be formed of silicon strained along a direction parallel to the interface between the layers 310, 320, while the first layer 310 can be formed of unstrained silicon. The structure 300 can be used in the fabrication of electronic devices, as described with reference to FIG. 4.

Alternatively, for example, the second layer 320 can be compressed Ge and the first layer 310 can be unstrained Ge. In this example, a compressed Ge film could first be formed on substrates such as Si, SiGe, or Ge. A compressed Ge layer could be created on, for example, a virtual SiGe substrate, and transferred as described previously to Si, SiGe, or Ge substrates. In the case of a Ge substrate, the resulting heterostructure is composed entirely of Ge, but the top surface layer would be compressed Ge and hence could have a superior hole transport characteristic as compared to a relaxed Ge substrate.

According to a general principle of the invention, one may form structures herein referred to as "homochemical heterojunctions." Typically, a heterojunction's usefulness is related the differences in the energies of electrons and holes on each side of a heterojunction. A typical prior art heterojunction achieves this difference in energy by a change in chemical composition across the heterojunction interface, such as a AlGaAs/GaAs interface or a SiGe/Si interface. Some junctions, according to principles of the invention, have, however, the same composition on either side of a junction. For example, according to principles of the invention, one can produce strained Si/Si and strained Ge/Ge heterojunctions, in which electrons and holes possess different energies across the heterojunction, but the chemical composition across the interface does not change. Such junctions have a strain difference across the heterojunction with little or no chemical difference; the strain difference can thus define the difference in electronic properties alone, without a chemical composition difference.

Figure 4:
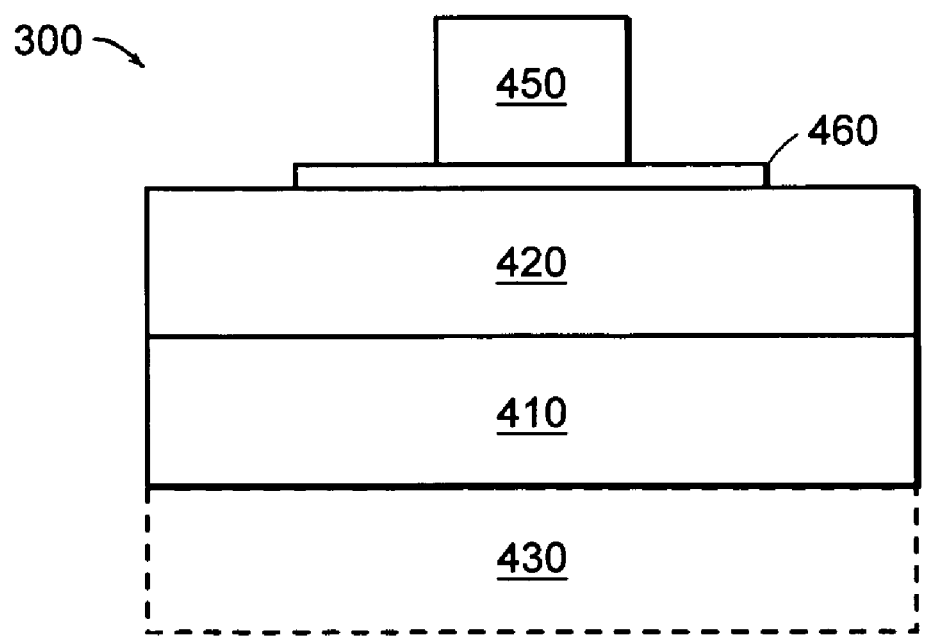
FIG. 4 is a cross-sectional diagram of an embodiment of an electronic device, according to principles of the invention.

FIG. 4 is a cross-sectional view of an embodiment of an electronic device 400, according to principles of the invention. The device 400 can be based on the structure 300, and can be fabricated via the method 100. The device 400 includes an unstrained silicon layer 410, a strained silicon layer 420 in contact with the unstrained silicon layer 410, a gate contact 450, and a gate dielectric 460 disposed between the strained silicon layer 420 and the gate contact 450. Application of a voltage to the gate contact can be used to control a channel in the strained silicon layer 420. The device can include a substrate 430 in contact with the unstrained silicon layer 410.

The strained silicon layer 420 can be shared by two or more electronic components, and can be continuous or discontinuous depending on the fabrication steps of a particular embodiment of a device, according to principles of the invention. For example, a shared layer 420, or portions of the layer 420, can extend continuously between two or more devices, or individual devices may be associated with spaced portions of the layer 420. Various implementations of the invention can improve carrier mobilities, for example, the mobility of electrons in a channel formed in the layer 420.

A strained SiGe layer can be formed on the second layer 420 to provide a p-type channel layer for p-type components. For example, improved hole mobilities can be provided by the p-type channel while the underlying second layer 420 can provide a n-type channel for n-type components. The components may be MOS transistors, for example, NMOS and PMOS transistors in an inverter. A suitable value of Y for enhanced hole mobility of $Si_{1-y}Ge_y$ in a compressively strained layer grown on silicon can be in a range of, for example, about 20% to 100%. The SiGe layer can have its compressive stress imposed by an underlying layer of, for example, SiGe having a Ge concentration of, for example, about 20%. In some alternative embodiments of the invention, Y is in a range of about 40% to 100%, and an underlying layer of SiGe has a Ge concentration in a range of about 15% to about 50%.

Figure 5:
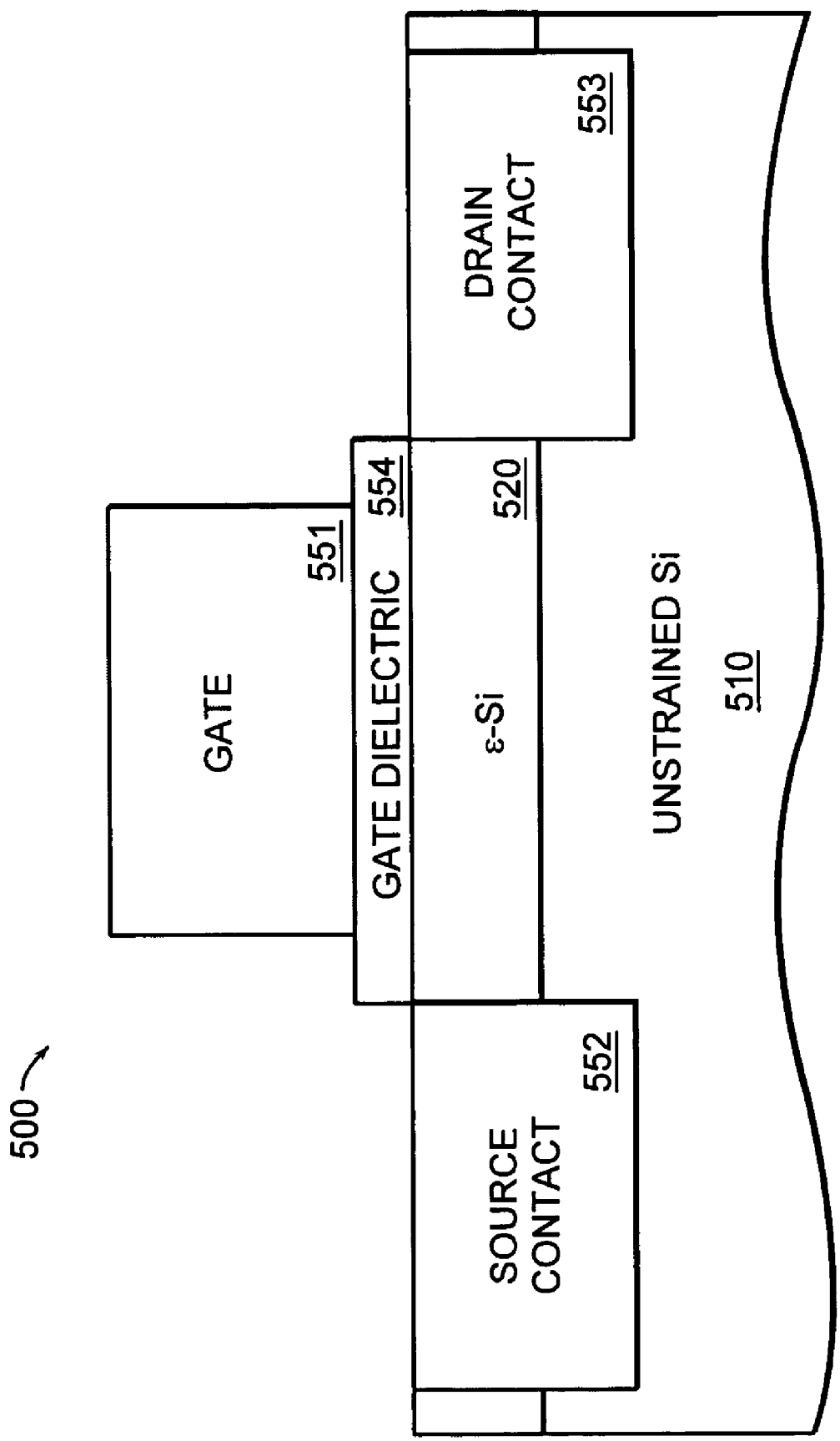
FIG. 5 is a cross-sectional diagram of an embodiment of an electronic device, according to principles of the invention.

FIG. 5 is a cross-sectional view of an embodiment of a transistor 500 that can be included in a device, such as the device 400, according to principles of the invention. The transistor 500 includes a gate contact 551, source and drain contacts 552, 553, such as silicide contacts, a gate dielectric layer 554, an unstrained silicon layer 510, and a tensilely strained silicon layer 520 bonded to the unstrained silicon layer 510. The unstrained silicon layer 510 preserves the strain in the tensilely strained layer 520 due to the bonding between the layers 510, 520. The tensilely strained silicon layer 520, and the unstrained silicon layer 510 may be shared with other components in a device.

The gate contact 551 can include, for example, doped conductive polycrystalline silicon and/or a silicide. Alternatively, the gate contact 550 may be formed of other conductive materials, such as, polycrystalline SiGe; a metal, e.g., titanium (Ti), tungsten (W), molybdenum (Mo), tantalum (Ta), or iridium (Ir), or metal compounds that provide an appropriate workfunction, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$).

The tensilely strained layer 520 may be formed by epitaxially growing Si on, for example, a strain-inducing layer of relaxed $Si_{1-x}Ge_x$ prior to bonding the grown strained Si to the unstrained silicon layer 510. The source and drain contacts 552, 553 can be formed, for example, by depositing a metal layer and reacting the metal layer with the silicon layers 510, 520.

The gate dielectric 554 is formed on the tensilely strained layer 520. The gate dielectric 554 can be formed by, for example, consuming a portion of the surface of the tensilely strained layer 520. The dielectric layer 554 can be formed by various methods conventional in the art, e.g., thermal oxidation or a deposition technique.

The gate dielectric 554 can be, for example, a 1.0 to 10.0 nm thick layer of silicon dioxide. Alternative embodiments of the transistor 500 include other suitable dielectric materials, e.g., silicon oxynitride, silicon nitride, a plurality of silicon nitride and silicon oxide layers, or a high-k dielectric. Alternative dielectric materials may be employed when, for example, a thin effective gate oxide thickness is desired, for example, equivalent to a $SiO_2$ layer thickness of 2.0 nm or less.

The transistor 500, according to principles of the invention, can be implemented as a NMOS or a PMOS component. The transistor 500 can include, for example, different doping types and levels in source, drain, and channel layer regions. A structure can thus include NMOS and PMOS transistors 500, utilizing a shared dual-channel layer, and both NMOS and PMOS components can provide improved channel performance.

Having thus described several aspects of at least one embodiment of this invention, it is to be appreciated various alterations, modifications, and improvements will readily occur to those skilled in the art. For example, first and second layer layers can be formed from elemental, alloy, and compound semiconductors other than Si, Ge, and SiGe. For example, the layers can be formed from a semiconductor that includes at least two group III and V elements, such as indium gallium arsenide, indium gallium phosphide, and gallium arsenide, or from a semiconductor that includes at least two group II and VI elements, such as zinc selenide, sulphur, cadmium telluride, and mercury telluride. Such alterations, modifications, and improvements are intended to be part of this disclosure, and are intended to be within the spirit and scope of the invention. Accordingly, the foregoing description and drawings are by way of example only.

What is claimed is:

1. A semiconductor-based structure, comprising:
   a first layer; and a second layer contacting directly to the first layer at an interface, there being no intermediate layer between the first and second layers, the second layer having a different lattice spacing parallel to the interface than a lattice spacing of the first layer parallel to the interface, the first and second layers each consisting essentially of the same semiconductor;

wherein a strain-inducing semiconductor layer induces strain into the second layer such that the lattice spacing of the second layer is different from the lattice spacing of the first layer, the strain-inducing semiconductor layer being different from the first layer;

wherein the second layer is atomically bonded to the first layer so as to keep the lattice spacing of the first layer different from the lattice spacing of the second layer.

2. The semiconductor-based structure of claim 1, wherein the first and second layers consist essentially of silicon, and the second layer has a greater lattice spacing parallel to the interface than the lattice spacing of the first layer parallel to the interface.

3. The semiconductor-based structure of claim 2, wherein the lattice spacing of the second layer is greater than the lattice spacing of the first layer by a value in a range of about 0.04% to about 2%.

4. The semiconductor-based structure of claim 1, wherein the first and second layers consist essentially of germanium, and the second layer has a smaller lattice spacing parallel to the interface than the lattice spacing of the first layer parallel to the interface.

5. The semiconductor-based structure of claim 1, wherein the first layer is substantially strain-free, and the lattice spacing of the second layer is associated with a strain of the second layer parallel to the interface.

6. The semiconductor-based structure of claim 1, wherein the interface is substantially free of oxide pockets.

7. The semiconductor-based structure of claim 1, wherein the interface is substantially free of voids.

8. The semiconductor-based structure of claim 1, wherein the interface is substantially free of dislocations to accommodate tilt and twist crystallographic misorientations between the first and second layers.

9. The semiconductor-based structure of claim 1, wherein the strain-inducing semiconductor layer is an epitaxial layer.

10. The semiconductor-based structure of claim 9, wherein the lattice spacing of the second layer is the same as a lattice spacing of the strain-inducing semiconductor layer.

11. An electronic device, comprising:
   a substantially strain-free substrate layer consisting essentially of silicon;
   a tensilely strained layer consisting essentially of silicon contacting directly to the substantially strain-free substrate layer, there being no intermediate layer between the tensilely strained layer and the substantially strain-free substrate layer;
   a gate dielectric layer adjacent to the tensilely strained layer; and
   a gate in contact with the gate dielectric layer for applying a voltage to mediate a channel in the tensilely strained layer;
   wherein the tensilely strained layer does not have the tensile strain induced therein by either the substantially strain-free substrate layer or the gate dielectric layer.

12. The electronic device of claim 11, wherein the electronic device is an NMOS transistor.

13. The electronic device of claim 11, wherein the tensile strain has been induced into the tensile-strained layer by a strain-inducing semiconductor layer that has been removed from the electronic device.

14. The electronic device of claim 13, wherein the strain-inducing semiconductor layer comprises a SiGe layer of graded composition.

* * * * *